(12) United States Patent
Bruce

(10) Patent No.: US 7,060,365 B2
(45) Date of Patent: Jun. 13, 2006

(54) THERMAL BARRIER COATING MATERIAL

(75) Inventor: Robert William Bruce, Loveland, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/063,962

(22) Filed: May 30, 2002

(65) Prior Publication Data

US 2003/0224200 A1 Dec. 4, 2003

(51) Int. Cl.
*B32B 15/04* (2006.01)
*F03B 3/12* (2006.01)

(52) U.S. Cl. .................. 428/632; 428/680; 428/701; 428/702; 416/241 B

(58) Field of Classification Search ............. 428/621, 428/629, 632, 633, 650, 670, 680, 469, 336, 428/699, 701, 702; 410/241 B
See application file for complete search history.

(56) References Cited

U.S. PATENT DOCUMENTS

| | | | |
|---|---|---|---|
| 4,576,874 A | * | 3/1986 | Spengler et al. |
| 4,774,150 A | | 9/1988 | Amano et al. |
| 4,886,768 A | * | 12/1989 | Tien |
| 5,789,330 A | * | 8/1998 | Kondo et al. ............... 501/103 |
| 6,025,078 A | * | 2/2000 | Rickerby |
| 6,117,560 A | | 9/2000 | Maloney |
| 6,352,788 B1 | | 3/2002 | Bruce |
| 586,115 A1 | * | 7/2003 | Rigney et al. |
| 6,812,176 B1 | * | 11/2004 | Zhu et al. .................. 501/102 |
| 2004/0197580 A1 | * | 10/2004 | Dorfman et al. ............ 428/472 |

FOREIGN PATENT DOCUMENTS

| | | |
|---|---|---|
| EP | 0 825 271 B1 | 2/1998 |
| EP | 1 249 515 A2 | 10/2002 |
| EP | 1 327 704 A1 | 7/2003 |

OTHER PUBLICATIONS

U.S. Appl. No. 09/833,446, filed Apr. 12, 2001, Rigney, et al (13DV-13490).

* cited by examiner

*Primary Examiner*—Jennifer McNeil
(74) *Attorney, Agent, or Firm*—David L. Narciso; Gary M. Hartman; Domenica N.S. Hartman

(57) ABSTRACT

A coating material, particularly a thermal barrier coating, for a component intended for use in a hostile environment, such as the superalloy turbine, combustor and augmentor components of a gas turbine engine. The coating material is zirconia that is partially stabilized with yttria and to which lanthana, neodymia and/or tantala are alloyed to increase the impact resistance of the coating.

8 Claims, 1 Drawing Sheet

THERMAL BARRIER COATING MATERIAL

BACKGROUND OF INVENTION

1. Field of the Invention

This invention relates to thermal-insulating coatings for components exposed to high temperatures, such as the hostile thermal environment of a gas turbine engine. More particularly, this invention is directed to a thermal barrier coating (TBC) of zirconia partially stabilized with less than four weight percent yttria and further alloyed with lanthana, neodymia or tantala to increase the impact resistance of the TBC.

2. Description of the Related Art

Higher operating temperatures for gas turbine engines are continuously sought in order to increase their efficiency. However, as operating temperatures increase, the high temperature durability of the components within the hot gas path of the engine must correspondingly increase. Significant advances in high temperature capabilities have been achieved through the formulation of nickel and cobalt-base superalloys. Nonetheless, when used to form components of the turbine, combustor and augmentor sections of a gas turbine engine, such alloys alone are often susceptible to damage by oxidation and hot corrosion attack, and as a result may not retain adequate mechanical properties. For this reason, these components are often protected by a thermal barrier coating (TBC) system. TBC systems typically include an environmentally-protective bond coat and a thermal-insulating topcoat, typically referred to as the TBC. Bond coat materials widely used in TBC systems include oxidation-resistant overlay coatings such as MCrAlX (where M is iron, cobalt and/or nickel, and X is yttrium or another rare earth or reactive element), and oxidation-resistant diffusion coatings such as diffusion aluminides that contain nickel-aluminum (NiAl) intermetallics.

Zirconia ($ZrO_2$) that is partially or fully stabilized by yttria ($Y_2O_3$), magnesia (MgO) or another alkaline-earth metal oxide, ceria ($CeO_2$) or another rare-earth metal oxide, or mixtures of these oxides has been employed as a TBC material. Binary yttria-stabilized zirconia (YSZ) has particularly found wide use as the TBC material on gas turbine engine components because of its low thermal conductivity, high temperature capability including desirable thermal cycle fatigue properties, and relative ease of deposition by plasma spraying, flame spraying and physical vapor deposition (PVD) techniques such as electron beam physical vapor deposition (EBPVD). TBC's employed in the highest temperature regions of gas turbine engines are often deposited by PVD, particularly EBPVD, which yields a strain-tolerant columnar grain structure that is able to expand and contract without causing damaging stresses that lead to spallation. Similar columnar microstructures can be produced using other atomic and molecular vapor processes, such as sputtering (e.g., high and low pressure, standard or collimated plume), ion plasma deposition, and all forms of melting and evaporation deposition processes (e.g., cathodic arc, laser melting, etc.). In contrast, plasma spraying techniques such as air plasma spraying (APS) deposit TBC material in the form of molten splats, resulting in a TBC characterized by a degree of inhomogeneity and porosity.

As is known in the art, zirconia is stabilized with the above-noted oxides to inhibit a tetragonal to monoclinic phase transformation at about 1000° C., which results in a volume expansion that can cause spallation. At room temperature, the more stable tetragonal phase is obtained and the undesirable monoclinic phase is minimized if zirconia is stabilized by at least about six weight percent yttria. An yttria content of seventeen weight percent or more ensures a fully stable cubic phase. Though thermal conductivity of YSZ decreases with increasing yttria content, the conventional practice has been to stabilize zirconia with at least six weight percent, and more typically to only partially stabilize zirconia with six to eight weight percent yttria (6–8% YSZ). Limited exceptions have generally included plasma-sprayed zirconia said to be stabilized by mixtures of yttria, magnesia, calcia or ceria, to which certain oxides may be added at specified levels to obtain a desired effect. For example, according to U.S. Pat. No. 4,774,150 to Amano et al., $Bi_2O_3$, $TiO_2$, $Tb_4O_7$, $Eu_2O_3$ and/or $Sm_2O_3$ may be added to certain layers of a TBC formed of zirconia stabilized by yttria, magnesia or calcia, for the purpose of serving as "luminous activators".

Contrary to the conventional practice of stabilizing zirconia with at least six weight percent yttria, U.S. Pat. No. 5,981,088 to Bruce et al. unexpectedly showed that if a YSZ coating has a columnar grain structure (e.g., deposited by EBPVD), superior spallation resistance can be achieved if zirconia is partially stabilized by less than six weight percent yttria. Significantly, YSZ TBC's in accordance with Bruce et al. contain the monoclinic phase, which was intentionally avoided in the prior art by the six to eight weight percent yttria.

Commonly-assigned U.S. Pat. No. 6,586,115 to Rigney et al. discloses a TBC of zirconia partially stabilized with yttria, preferably not more than three weight percent yttria (3% YSZ), to which one or more additional metal oxides having an ion size difference relative to zirconium ions ($Zr^{4+}$) are alloyed to reduce the thermal conductivity of the TBC. The additional metal oxides are disclosed to be limited to the alkaline-earth metal oxides magnesia (MgO), calcia (CaO), strontia (SrO) and barium oxide (BaO), the rare-earth metal oxides lanthana ($La_2O_3$), ceria ($CeO_2$), neodymia ($Nd_2O_3$), gadolinium oxide ($Gd_2O_3$) and dysprosia ($Dy_2O_3$), as well as such metal oxides as nickel oxide (NiO), ferric oxide ($Fe_2O_3$), cobaltous oxide (CoO), and scandium oxide ($Sc_2O_3$). Rigney et al. teaches that the required degree of crystallographic defects and/or lattice strain excludes such oxides as hafnia ($HfO_2$), titania ($TiO_2$), tantala ($Ta_2O_5$), niobia ($Nb_2O_5$), erbia ($Er_2O_3$) and ytterbia ($Yb_2O_3$), as well as others.

In addition to spallation resistance and low thermal conductivities, TBC's on gas turbine engine components are required to withstand damage from impact by hard particles of varying sizes that are generated upstream in the engine or enter the high velocity gas stream through the air intake of a gas turbine engine. The result of impingement can be erosive wear (generally from smaller particles) or impact spallation from larger particles. In regard to the YSZ TBC of Bruce et al., it has been observed that impact resistance decreases with yttria contents of less than four weight percent. Commonly-assigned U.S. Pat. No. 6,352,788 to Bruce has identified that YSZ containing about one up to less than six weight percent yttria in combination with about one to about ten weight percent of magnesia and/or hafnia exhibits improved impact resistance. It can be appreciated that it would be desirable if other compositions were available for TBC's that exhibit improved impact resistance, particularly as TBC's are employed on components intended for more demanding engine designs.

SUMMARY OF INVENTION

The present invention generally provides a coating material, particularly a thermal barrier coating (TBC), for a component intended for use in a hostile environment, such as the superalloy turbine, combustor and augmentor components of a gas turbine engine. The coating material is zirconia that is partially stabilized with yttria, and to which lanthana, neodymia and/or tantala are alloyed to increase the impact resistance of the coating. Improvements obtained by this invention are particularly evident with YSZ coatings having a columnar grain structure, such as those deposited by EBPVD and other PVD techniques, though the invention is also applicable to coatings deposited by such methods as plasma spraying.

A significant advantage of the present invention is that, by improving the impact resistance, the coating is capable of greater reliability, especially on the leading edge of a turbine airfoil. The greatest benefit appears to be with limited additions of lanthana, neodymia and/or tantala, preferably in amounts of up to about five weight percent for lanthana and neodymia and up to about ten weight percent for tantala. Coatings of this invention also exhibit desirable thermal cycle fatigue lives and thermal conductivities. It should be noted that while U.S. Pat. No. 6,586,115 to Rigney et al. discloses a YSZ TBC containing lanthana, neodymia or another oxide, the purpose is to reduce thermal conductivity. Furthermore, Rigney et al. teach that the amount of lanthana or neodymia added to the YSZ composition is based on the ability to create crystallographic defects and/or lattice strain with the TBC. To have this effect, Rigney et al. require lanthana and neodymia in amounts of at least 5.8 and 5.7 weight percent, respectively, which are higher than what has been determined by this invention to have a significant effect on impact resistance.

Other objects and advantages of this invention will be better appreciated from the following detailed description.

DETAILED DESCRIPTION

Figure 1:
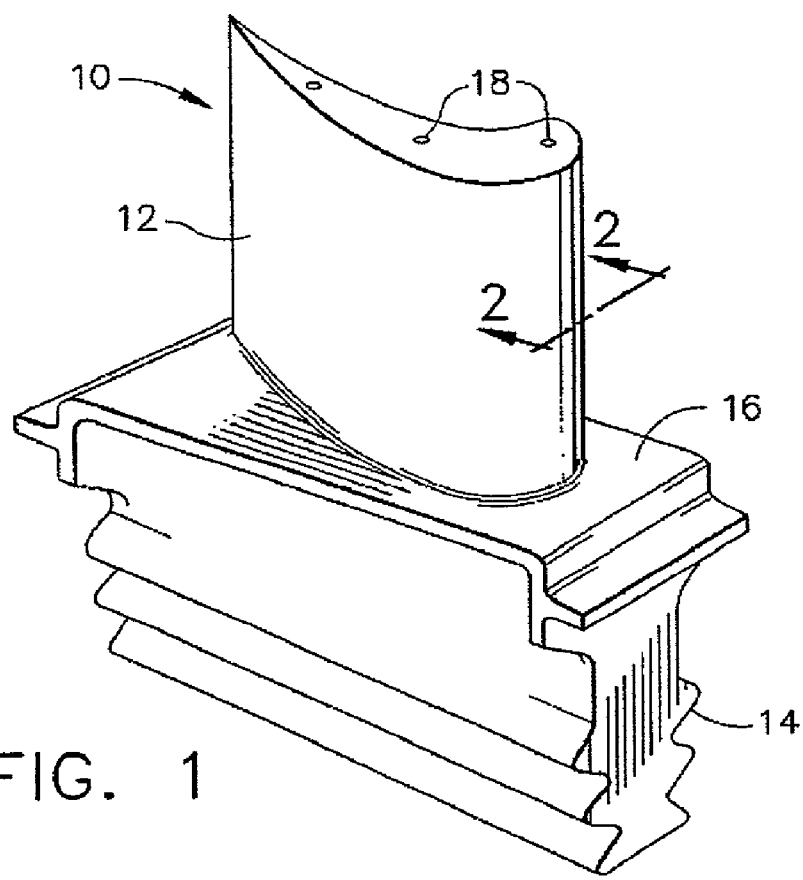
FIG. 1 is a perspective view of a high pressure turbine blade.

The present invention is generally applicable to components subjected to high temperatures, and particularly to components such as the high and low pressure turbine nozzles and blades, shrouds, combustor liners and augmentor hardware of gas turbine engines. An example of a high pressure turbine blade 10 is shown in FIG. 1. The blade 10 generally includes an airfoil 12 against which hot combustion gases are directed during operation of the gas turbine engine, and whose surface is therefore subjected to hot combustion gases as well as attack by oxidation, corrosion and erosion. The airfoil 12 is protected from its hostile operating environment by a thermal barrier coating (TBC) system schematically depicted in FIG. 2. The airfoil 12 is anchored to a turbine disk (not shown) with a dovetail 14 formed on a root section 16 of the blade 10. Cooling passages 18 are present in the airfoil 12 through which bleed air is forced to transfer heat from the blade 10. While the advantages of this invention are particularly desirable for high pressure turbine blades of the type shown in FIG. 1, the teachings of this invention are generally applicable to any component on which a thermal barrier coating may be used to protect the component from a high temperature environment.

Figure 2:
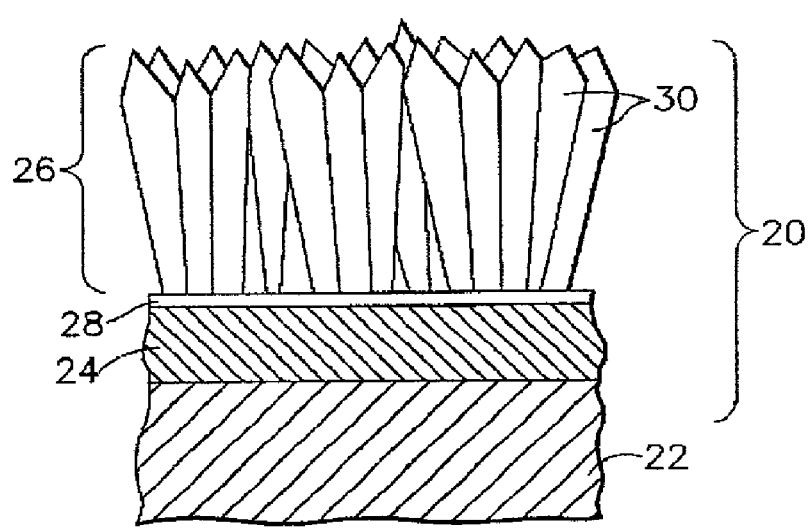
FIG. 2 schematically represents a cross-sectional view of the blade of FIG. 1 along line 2—2, and shows a thermal barrier coating system on the blade in accordance with a preferred embodiment of the invention.

The TBC system 20 is represented in FIG. 2 as including a metallic bond coat 24 that overlies the surface of a substrate 22, the latter of which is typically a superalloy and the base material of the blade 10. As is typical with TBC systems for components of gas turbine engines, the bond coat 24 is preferably an aluminum-rich composition, such as an overlay coating of an MCrAlX alloy or a diffusion coating such as a diffusion aluminide or a diffusion platinum aluminide of a type known in the art. Aluminum-rich bond coats of this type develop an aluminum oxide (alumina) scale 28, which is grown by oxidation of the bond coat 24. The alumina scale 28 chemically bonds a TBC 26, formed of a thermal-insulating material, to the bond coat 24 and substrate 22. The TBC 26 of FIG. 2 is represented as having a strain-tolerant microstructure of columnar grains 30. As known in the art, such columnar microstructures can be achieved by depositing the TBC 26 using a physical vapor deposition technique, such as EBPVD. The invention is also believed to be applicable to noncolumnar TBC deposited by such methods as plasma spraying, including air plasma spraying (APS). A TBC of this type is in the form of molten splats, resulting in a microstructure characterized by irregular flattened grains and a degree of inhomogeneity and porosity.

As with prior art TBC's, the TBC 26 of this invention is intended to be deposited to a thickness that is sufficient to provide the required thermal protection for the underlying substrate 22 and blade 10, generally on the order of about 75 to about 300 micrometers. According to the invention, the thermal-insulating material of the TBC 26 is based on binary yttria-stabilized zirconia (YSZ) containing up to about ten weight percent yttria but further alloyed to contain lanthana ($La_2O_3$), neodymia ($Nd_2O_3$) and/or tantala ($Ta_2O_5$) as an oxide additive. Lanthana, neodymia and tantala have each been shown by this invention to have a clear effect on impact resistance of YSZ, particularly YSZ containing up to about four weight percent yttria. Based on an investigation discussed below, lanthana, neodymia, tantala or a mixture thereof is believed to have the beneficial effect of increasing impact resistance. Effective amounts for the additive oxide are believed to be up to about five weight percent lanthana, up to about five weight percent neodymia, up to about ten weight percent tantala, or up to about ten weight percent of a mixture thereof. Preferred amounts for the additive oxide are about 0.1 to about 4 weight percent lanthana, or about 0.1 to about 4 weight percent neodymia, about 0.5 to about 8 weight percent tantala, or about 0.1 to about 8 weight percent of a mixture thereof.

The mechanism by which additions of lanthana, neodymia and/or tantala improve impact resistance is not known. It may be that these oxides are able to internally absorb energy, and/or may improve bonding of the TBC 26 to the substrate 22. Tantala is believed to inhibit sintering of the grains 30 of the TBC 26, which may contribute to the observed improvement in impact resistance, and may also slow the increase in thermal conductivity that occurs with YSZ as a result of grain sintering.

In an investigation leading to this invention, TBC's were deposited by EBPVD on specimens formed of the superalloy René N5 on which a diffusion platinum aluminide bond coat had been deposited. Some of the specimens were buttons for the purpose of evaluating thermal cycle fatigue resistance, while others were in the form of pins for evaluating erosion and impact resistance. Some of each type of specimen were coated by evaporating an ingot of 7%YSZ (zirconia stabilized by about 7 wt. % yttria) to deposit a conventional 7% YSZ TBC. Other specimens were coated by evaporating an ingot of 4% YSZ to deposit a TBC in accordance with U.S. Pat. No. 5,981,088 to Bruce et al. Finally, additional specimens were coated by co-evaporating separate ingots of 4% YSZ and either lanthana, neodymia or tantala. The TBC's were deposited to have thicknesses on the order of about 110 to about 120 micrometers. As a result of the deposition process, lanthana, neodymia and tantala were uniformly deposited atom-by-atom throughout their respective YSZ TBC's, i.e., not as particles or concentrated in certain regions or layers of the coatings. Each of the TBC's consisted essentially of zirconia stabilized by about 3 to about 4 weight percent yttria, and one of the additional oxides of this invention in the following amounts: about 0.07 to about 0.90 weight percent lanthana, about 0.25 to about 0.58 weight percent neodymia, or about 0.77 to about 3.93 weight percent tantala.

The average thermal conductivities and densities of the specimens are summarized in Table I below. Thermal conductivity is reported in the as-deposited condition and following a thermal aging treatment in which the specimens evaluated for conductivity were held at about 1200° C. for about two hours to determine the thermal stability of the coatings.

TABLE I

| Specimen (Coating) | Thermal Conductivity As-Deposited (W/mK) | Thermal Conductivity Aged (W/mK) | Change (%) | Density (g/cc) |
|---|---|---|---|---|
| 7% YSZ | 1.60 | 1.80 | 12.5 | 4.60 |
| 4% YSZ | 1.80 | N/A | N/A | 4.18 |
| YSZ + lanthana | 1.62 | 1.73 | 6.8 | 4.74 |
| YSZ + neodymia | 1.44 | 1.69 | 17.4 | 4.49 |
| YSZ + tantala | 1.69 | 1.80 | 6.5 | 4.89 |

The above results evidenced that the modified YSZ coatings containing lanthana, neodymia and tantala in the amounts evaluated had aged thermal conductivities comparable to or lower than that of the industry standard 7% YSZ material.

Impact and erosion tests were conducted on the pin specimens at high temperatures (about 1230° C.) and high gas velocities while subjected to an alumina powder injected into the gas stream. An alumina powder with an average particle size of about 50 micrometers was used to evaluate impact resistance using a gas stream velocity of about Mach 0.03, while an alumina powder with an average particle size of about 560 micrometers was used to evaluate erosion resistance using a gas stream velocity of about Mach 0.5. The specimens were rotated at a rate of about 500 rpm while subjected to the high velocity powder. Both erosion and impact resistance were measured in terms of the number of grams of erodent required to break through the thermal barrier coating to the underlying bond coat. The minimum and maximum erosion and impact resistances exhibited by the evaluated specimens are reported in Table II below.

TABLE II

| Specimen (Coating) | Erosion (grams) minimum | Erosion (grams) maximum | Impact (grams) minimum | Impact (grams) maximum |
|---|---|---|---|---|
| 7% YSZ | 900 | 1000 | 700 | 900 |
| 4% YSZ | 900 | 1000 | 1100 | 1400 |
| YSZ + lanthana | 100 | 1200 | 2100 | 2500 |
| YSZ + neodymia | 1000 | 1000 | 1100 | 2100 |
| YSZ + tantala | 900 | 1000 | 1000 | 1900 |

From the above, it can be seen that the TBC''s alloyed with lanthana, neodymia and tantala exhibited the same or better resistance to erosion, were capable of significantly greater impact resistance than the 4% YSZ specimen, and exhibited far better impact resistance than the 7% YSZ specimens.

Furnace cycle tests (FCT) were performed on the button specimens using one-hour cycles to a temperature of about 2075° F. (about 1135° C.), and continued until about 10% spallation of the coating occurred. The 7% YSZ and 4% YSZ specimens exhibited an average life of about 500 and 550 cycles, respectively. In comparison, the YSZ+lanthana, neodymia and tantala specimens exhibited average FCT lives of about 513, 727 and 873 cycles, respectively.

The tests reported above showed that a columnar zirconia-based TBC containing about three to four weight percent yttria and alloyed to contain about 0.05 to about 1 weight percent lanthana, about 0.2 to about 0.6 weight percent neodymia, or about 0.7 to about 4 weight percent tantala exhibit significantly improved impact resistance over 4% YSZ and conventional 7% YSZ coatings under hostile thermal conditions, while also exhibiting suitable thermal properties and resistance to erosion and thermal fatigue. From these results, it was concluded that comparable results should be obtained for YSZ TBC containing about one up to about ten weight percent yttria and about 0.1 to about 4 weight percent lanthana, about 0.1 to about 4 weight percent neodymia, or about 0.5 to about 8 weight percent tantala, with additions of up to five weight percent of lanthana or neodymia or up to ten weight percent of tantala being acceptable. It is also believed that a combination of lanthana, neodymia and/or tantala in an amount of about 0.1 to about 8 weight percent should also be effective.

While the invention has been described in terms of a preferred embodiment, it is apparent that other forms could be adopted by one skilled in the art. Accordingly, the scope of the invention is to be limited only by the following claims.

The invention claim is:

1. A component having a coating on a surface thereof, the coating consisting of zirconia partially stabilized by up to about 10 weight percent yttria and to which is alloyed an oxide additive of tantala in an amount of about 0.5 to about 8 weight percent, the oxide additive being uniformly incorporated atom-by-atom throughout the coating.

2. A component according to claim 1, wherein the zirconia is partially stabilized by about one to about four weight percent yttria.

3. A component according to claim 1, further comprising a metallic bond coat adhering the coating to the component.

4. A component according to claim 3, wherein the metallic bond coat is a diffusion platinum aluminide.

5. A component according to claim 1, wherein the component is a superalloy airfoil component of a gas turbine engine.

6. A gas turbine engine component comprising:
a superalloy substrate;
a metallic bond coat on a surface of the substrate; and a thermal barrier coating having a columnar microstructure, the thermal barrier coating consisting of zirconia partially stabilized by about one to about four weight percent yttria and in which is alloyed an oxide additive of tantala in an amount of about 0.5 to about 8 weight percent, oxide additive being uniformly incorporated atom-by-atom throughout the coating.

7. A gas turbine engine component according to claim 6, wherein the metallic bond coat is a diffusion platinum aluminide.

8. A gas turbine engine component according to claim 6, wherein the component is an airfoil component.

* * * * *